United States Patent
Shin et al.

(10) Patent No.: US 12,080,645 B2
(45) Date of Patent: Sep. 3, 2024

(54) SEMICONDUCTOR DEVICES INCLUDING LINE IDENTIFIER

(71) Applicant: SAMSUNG ELECTRONICS CO., LTD., Suwon-si (KR)

(72) Inventors: Yewon Shin, Hwaseong-si (KR); Jaesun Yun, Anyang-si (KR); Seungjun Lee, Hwaseong-si (KR); Jongmin Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/114,337

(22) Filed: Feb. 27, 2023

(65) Prior Publication Data

US 2023/0215805 A1  Jul. 6, 2023

Related U.S. Application Data

(63) Continuation of application No. 16/950,031, filed on Nov. 17, 2020, now Pat. No. 11,594,487.

(30) Foreign Application Priority Data

May 25, 2020  (KR) .......................... 10-2020-0062192

(51) Int. Cl.
*H01L 23/528* (2006.01)
*H01L 23/522* (2006.01)
(Continued)

(52) U.S. Cl.
CPC ...... *H01L 23/5283* (2013.01); *H01L 23/5226* (2013.01); *H10B 43/27* (2023.02); *H10B 43/40* (2023.02)

(58) Field of Classification Search
CPC ............. H01L 23/5283; H01L 23/5226; H01L 23/544; H01L 21/76816; H01L 21/76877;
(Continued)

(56) References Cited

U.S. PATENT DOCUMENTS

| 5,378,649 A | * | 1/1995 | Huang ................... H10B 20/00 438/278 |
| 6,534,803 B2 | | 3/2003 | Ohkubo |

(Continued)

FOREIGN PATENT DOCUMENTS

| KR | 10-2011-0065760 | 6/2011 |
| KR | 10-1660432 | 9/2016 |
| KR | 10-2016-0147423 | 12/2016 |

*Primary Examiner* — Galina G Yushina
(74) *Attorney, Agent, or Firm* — F. CHAU & ASSOCIATES, LLC

(57) ABSTRACT

A semiconductor device includes a stacked structure disposed on a substrate. The stacked structure includes a plurality of insulation layers and a plurality of electrode layers alternately stacked in a third direction intersecting with first and second directions. A plurality of channel structures extends through the stacked structure in the third direction. A first wiring group includes a plurality of first horizontal wirings disposed on the stacked structure that are arranged in the first direction and extends in the second direction. A second wiring group includes a plurality of second horizontal wirings disposed on the stacked structure that are arranged in the first direction and extends in the second direction. Each of the plurality of first and second horizontal wirings are connected to corresponding one of the plurality of channel structures. A first line identifier is disposed between the first wiring group and the second wiring group.

20 Claims, 7 Drawing Sheets

(51) Int. Cl.
*H10B 43/27* (2023.01)
*H10B 43/40* (2023.01)

(58) Field of Classification Search
CPC ......... H01L 27/0207; H01L 2223/5442; H01L 2223/54433; H10B 43/27; H10B 43/40; H10B 43/10; H10B 43/00; H10B 43/35
See application file for complete search history.

(56) References Cited

U.S. PATENT DOCUMENTS

| | | |
|---|---|---|
| 6,670,665 B2 | 12/2003 | Beer et al. |
| 9,698,151 B2 | 7/2017 | Lee et al. |
| 10,546,814 B2 | 1/2020 | Tak et al. |
| 10,854,627 B1 * | 12/2020 | Moriyama ........ H01L 29/66666 |
| 2004/0190350 A1 * | 9/2004 | Wada ................. G11C 11/4076 |
| | | 257/E21.657 |
| 2006/0220240 A1 | 10/2006 | Lee et al. |
| 2010/0193861 A1 * | 8/2010 | Shim ................ H01L 29/66825 |
| | | 257/329 |
| 2011/0298013 A1 | 12/2011 | Hwang et al. |
| 2013/0286735 A1 | 10/2013 | Hwang et al. |
| 2016/0118122 A1 | 4/2016 | Hwang et al. |
| 2016/0351581 A1 | 12/2016 | Ahn |
| 2016/0365354 A1 | 12/2016 | Lee |
| 2017/0062350 A1 * | 3/2017 | Tagami ............... H01L 23/5329 |
| 2017/0103993 A1 * | 4/2017 | Lee ........................ H10B 43/35 |
| 2017/0125433 A1 * | 5/2017 | Ogawa ................ H01L 23/5226 |
| 2021/0173559 A1 | 6/2021 | Nishikawa et al. |
| 2021/0366829 A1 | 11/2021 | Shin et al. |

* cited by examiner 255
(356)

255
(356)

255
(356)

255
(356)

255
(356)

255
(356)

SEMICONDUCTOR DEVICES INCLUDING LINE IDENTIFIER

CROSS-REFERENCE TO THE RELATED APPLICATIONS

This application is a continuation of U.S. patent application Ser. No. 16/950,031 filed on Nov. 17, 2020, which claims priority under 35 U.S.C. § 119 to Korean Patent Application No. 10-2020-0062192, filed on May 25, 2020 in the Korean Intellectual Property Office, the disclosures of which are incorporated by reference in their entireties herein.

1. TECHNICAL FIELD

The present inventive concepts relate to semiconductor devices including a line identifier.

2. DISCUSSION OF RELATED ART

Semiconductor devices with a high level of integration may include a plurality of wirings that are parallel to one another at the same level on a substrate. An increase in the number of wirings makes it difficult to check a position of one wiring selected from among the plurality of wirings. For example, it is difficult to accurately recognize a position of one bit line selected from among a plurality of bit lines that are parallel to one another.

SUMMARY

Exemplary embodiments of the present inventive concepts provide semiconductor devices which provide a relatively easy identification of a position of each wiring among a plurality of wirings that are parallel to one another.

A semiconductor device in accordance with exemplary embodiments of the present inventive concepts may include a stacked structure disposed on a substrate. The stacked structure includes a plurality of insulation layers and a plurality of electrode layers. A plurality of channel structures extends through the stacked structure. A first wiring group includes a plurality of first horizontal wirings disposed on the stacked structure. The plurality of first horizontal wirings is arranged in a first direction and extends in a second direction intersecting with the first direction. Each of the plurality of first horizontal wirings is connected to corresponding one of the plurality of channel structures. A second wiring group includes a plurality of second horizontal wirings disposed on the stacked structure. The plurality of second horizontal wirings is arranged in the first direction and extends in the second direction. Each of the plurality of second horizontal wirings is connected to corresponding one of the plurality of channel structures. A first line identifier is disposed between the first wiring group and the second wiring group. The plurality of insulation layers and the plurality of electrode layers are alternately stacked in a third direction intersecting with the first direction and the second direction. Each of the plurality of channel structures extends in the third direction.

A semiconductor device in accordance with exemplary embodiments of the present inventive concepts may include a first wiring group including a plurality of first horizontal wirings disposed on a substrate. The plurality of first horizontal wirings is arranged in a first direction and extends in a second direction intersecting with the first direction. A second wiring group includes a plurality of second horizontal wirings disposed on the substrate. The plurality of second horizontal wirings is arranged in the first direction and extends in the second direction. A line identifier is disposed between the first wiring group and the second wiring group. The line identifier is positioned in an overlap region disposed between one first horizontal wiring that is closest to the line identifier among the plurality of first horizontal wirings and one second horizontal wiring that is closest to the line identifier among the plurality of second horizontal wirings.

A semiconductor device in accordance with exemplary embodiments of the present inventive concepts may include a source line disposed on a substrate. A stacked structure including a plurality of insulation layers and a plurality of electrode layers is disposed on the source line. A plurality of channel structures passes through the stacked structure and contacts the source line. A first wiring group includes a plurality of first horizontal wirings disposed on the stacked structure. The plurality of first horizontal wirings is arranged in a first direction and extends in a second direction intersecting with the first direction. Each of the plurality of first horizontal wirings is connected to corresponding one of the plurality of channel structures. A second wiring group includes a plurality of second horizontal wirings disposed on the stacked structure. The plurality of second horizontal wirings is arranged in the first direction and extends in the second direction. Each of the plurality of second horizontal wirings is connected to corresponding one of the plurality of channel structures. A first line identifier is disposed between the first wiring group and the second wiring group. A third wiring group includes a plurality of third horizontal wirings disposed on the substrate. The plurality of third horizontal wirings is arranged in the second direction and extends in the first direction. Each of the plurality of third horizontal wirings is connected to corresponding one of the plurality of electrode layers. A fourth wiring group includes a plurality of fourth horizontal wirings disposed on the substrate. The plurality of fourth horizontal wirings is arranged in the second direction and extends in the first direction. Each of the plurality of fourth horizontal wirings is connected to corresponding one of the plurality of electrode layers. The plurality of insulation layers and the plurality of electrode layers are alternately stacked in a third direction intersecting with the first direction and the second direction. Each of the plurality of channel structures extends in the third direction.

DETAILED DESCRIPTION OF EXEMPLARY EMBODIMENTS

Figure 1:
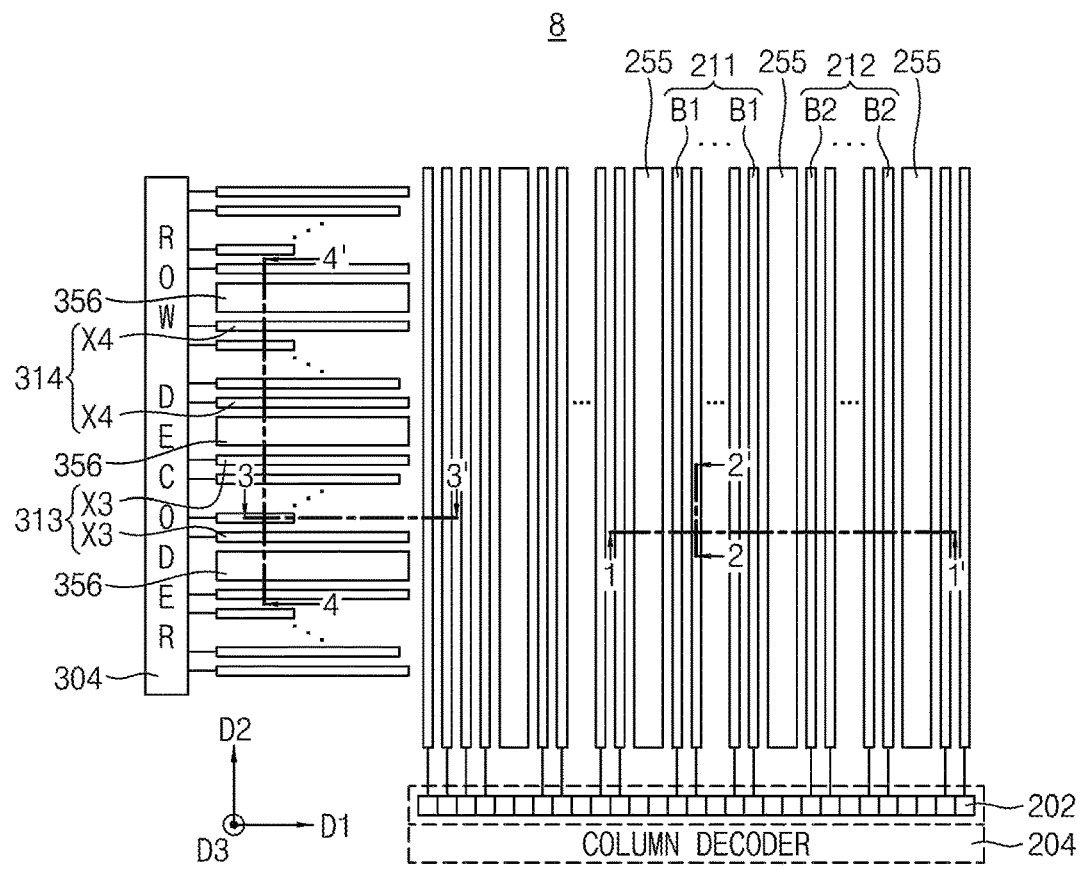
FIG. 1 is a schematic view of a semiconductor device of portion 8 of FIG. 2 according to an exemplary embodiment of the present inventive concepts.
Figure 2:
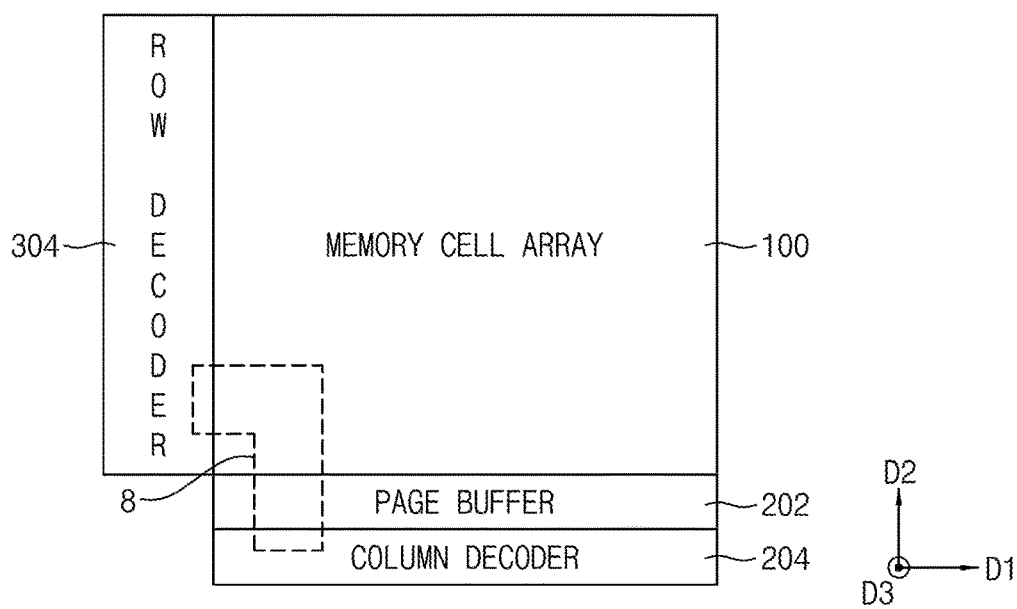
FIG. 2 is a schematic view of a semiconductor device according to an exemplary embodiment of the present inventive concepts.
Figure 9:
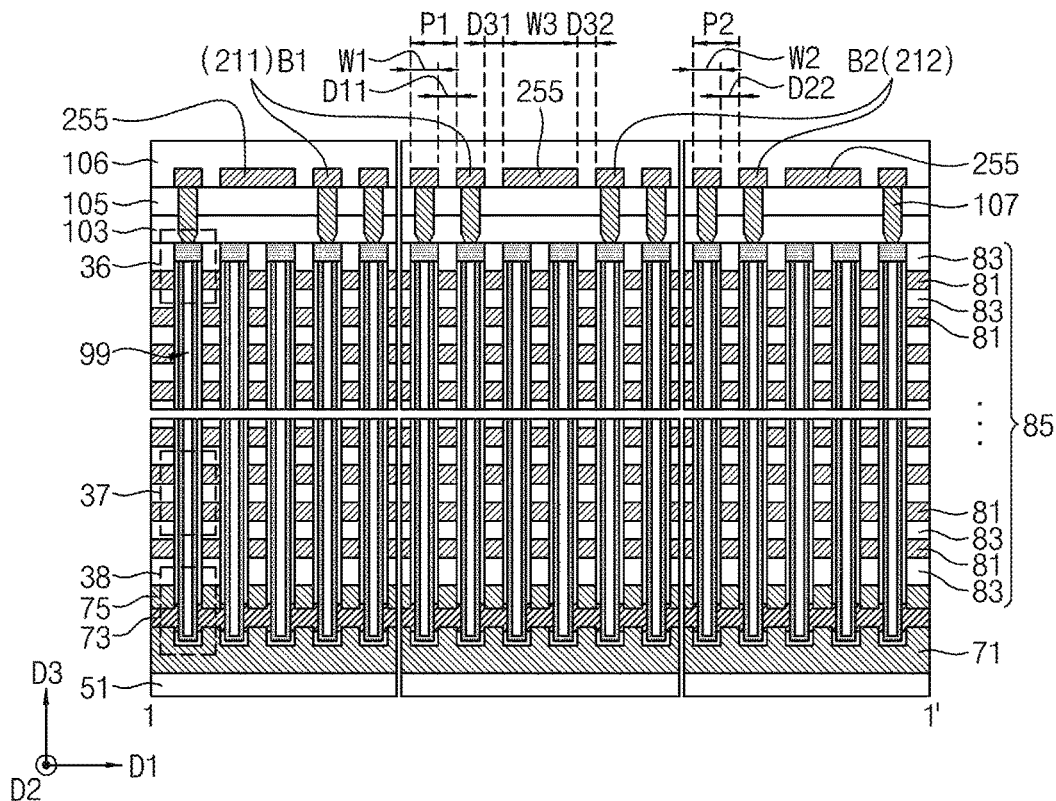
FIG. 9 is a cross-sectional views of a semiconductor device taken along line 1-1' of FIG. 1 according to an exemplary embodiment of the present inventive concepts.
Figure 10:
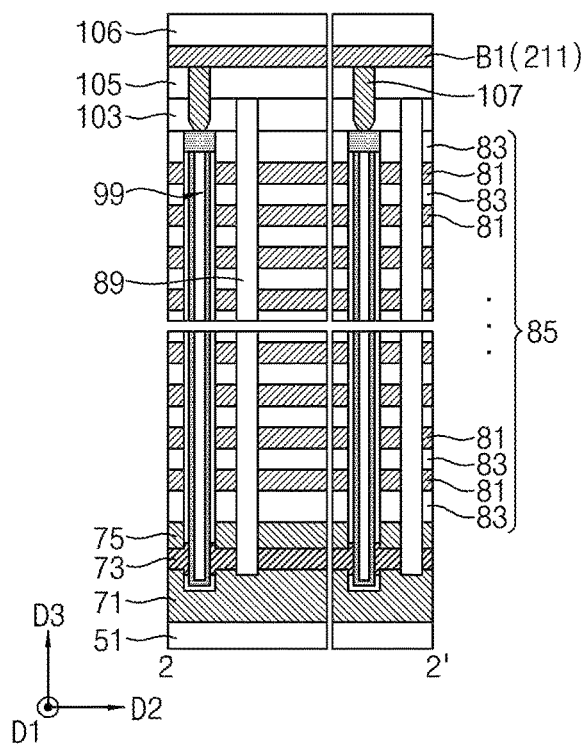
FIG. 10 is a cross-sectional views of a semiconductor device taken along line 2-2' of FIG. 1 according to an exemplary embodiment of the present inventive concepts.
Figure 11:
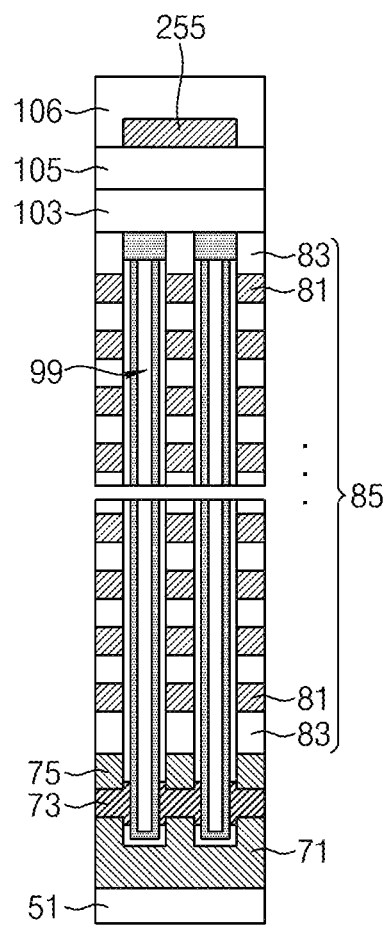
FIGS. 11 to 13 are partial views illustrating some elements of the semiconductor devices of FIG. 9 according to exemplary embodiments of the present inventive concepts.
Figure 12:
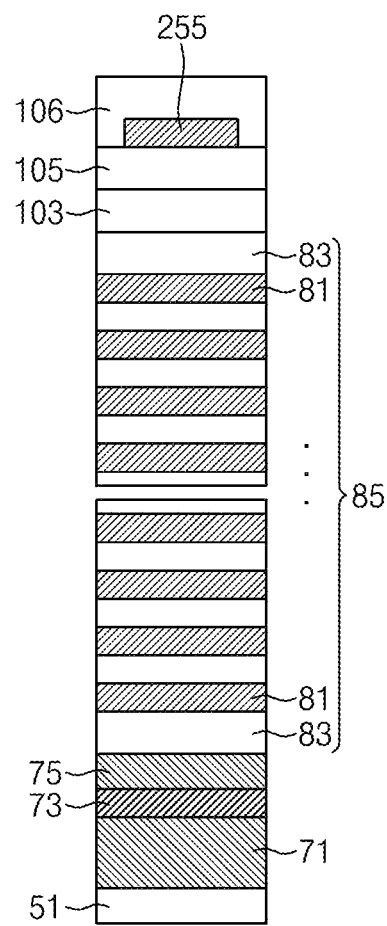
Figure 13:
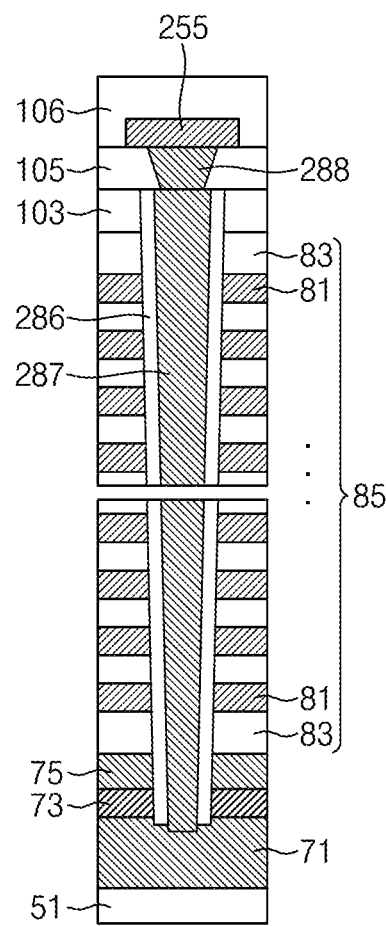
Figure 14:
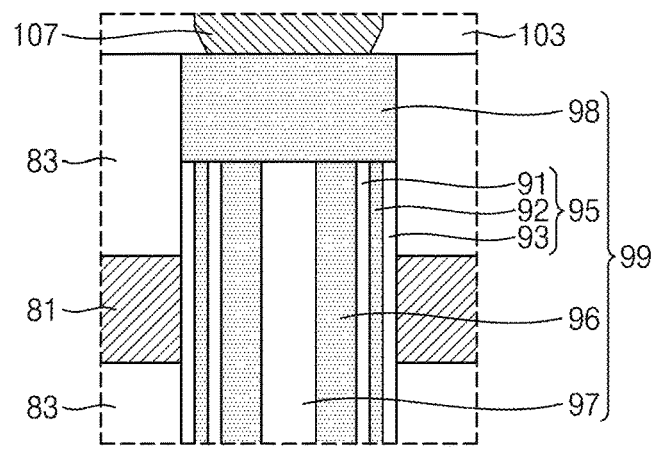
FIGS. 14 to 16 are enlarged views illustrating portions 36 to 38 of the semiconductor device of FIG. 9, respectively, according to exemplary embodiments of the present inventive concepts.
Figure 15:
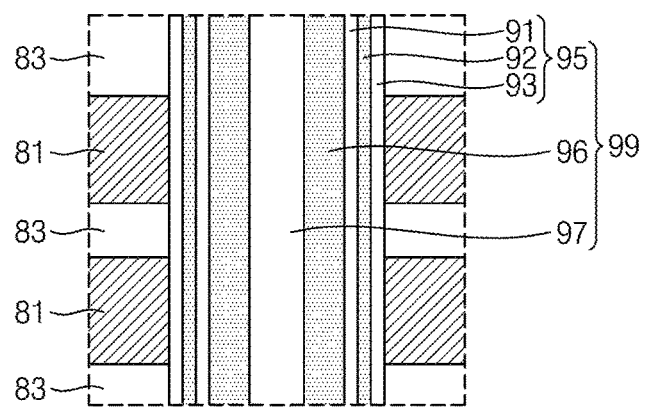
Figure 16:
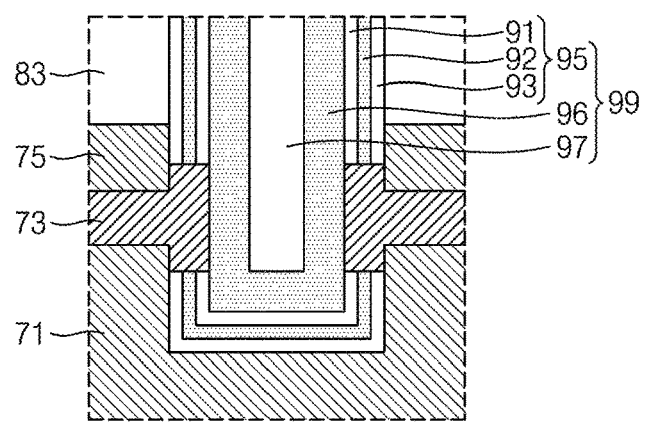
Figure 17:
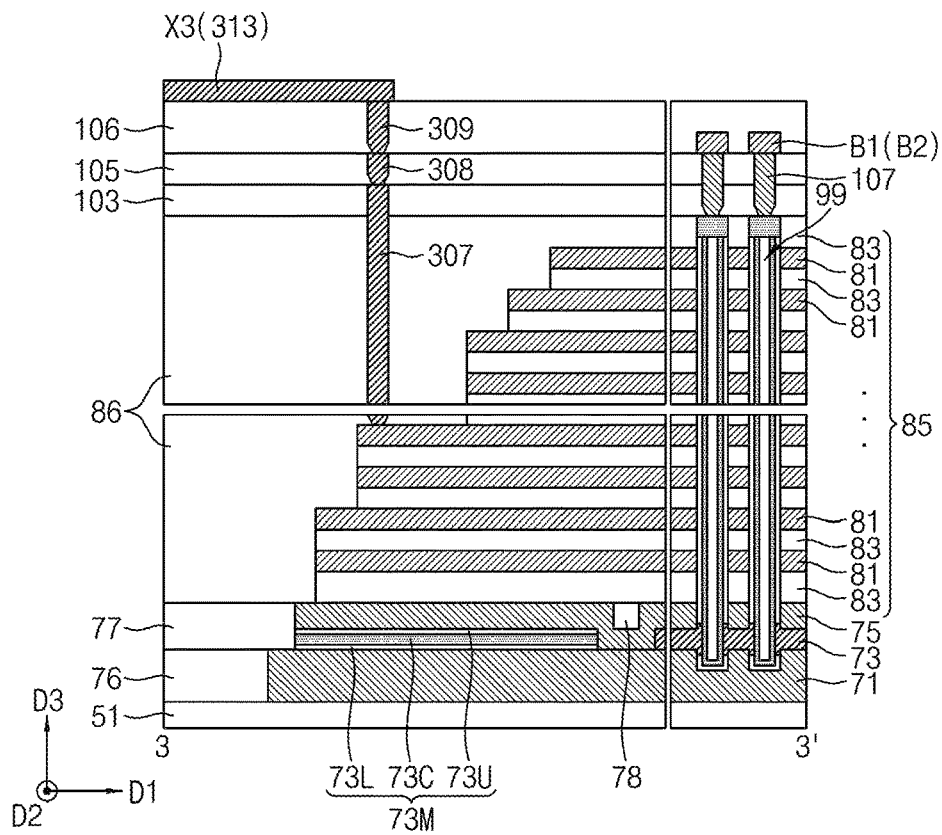
FIGS. 17 and 18 are cross-sectional views of semiconductor devices according to exemplary embodiments of the present inventive concepts.
Figure 18:
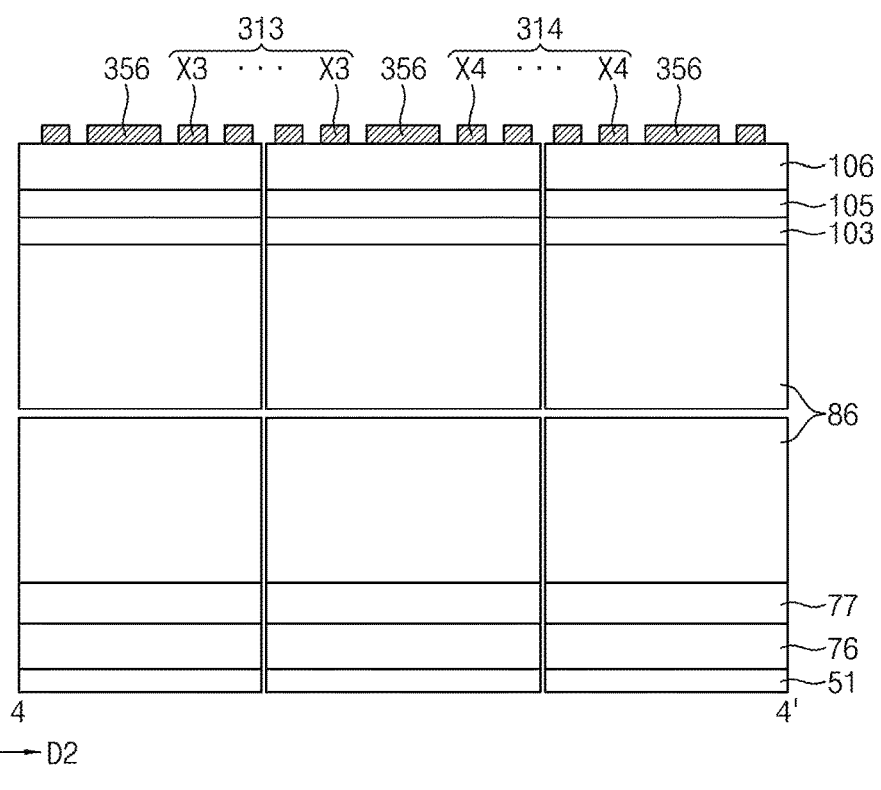

FIGS. 1 and 2 are schematic views for describing semiconductor devices according to exemplary embodiments of the present inventive concepts. FIG. 1 may be an enlarged view illustrating in detail a portion 8 of FIG. 2. FIGS. 3 to 8 are plan views illustrating some elements of FIG. 1. FIG. 9 is a cross-sectional view taken along line 1-1' of FIG. 1, for describing semiconductor devices according to exemplary embodiments of the present inventive concepts, and FIG. 10 is a cross-sectional view taken along line 2-2' of FIG. 1. FIGS. 11 to 13 are partial views illustrating some elements of FIG. 9. FIGS. 14 to 16 are enlarged views illustrating portions 36 to 38 of FIG. 9, respectively. FIG. 17 is a cross-sectional view taken along line 3-3' of FIG. 1, for describing semiconductor devices according to exemplary embodiments of the present inventive concepts, and FIG. 18 is a cross-sectional view taken along line 4-4' of FIG. 1. Semiconductor devices according to exemplary embodiments of the present inventive concepts may include three-dimensional (3D) flash memory such as vertical NAND (VNAND) flash memory.

Referring to FIG. 1, semiconductor devices according to an exemplary embodiment of the present inventive concepts may include a page buffer 202, a column decoder 204, a row decoder 304, a first wiring group 211 including a plurality of first horizontal wirings B1, a second wiring group 212 including a plurality of second horizontal wirings B2, a plurality of first line identifiers 255, a third wiring group 313 including a plurality of third horizontal wirings X3, a fourth wiring group 314 including a plurality of fourth horizontal wirings X4, and a plurality of second line identifiers 356. In an exemplary embodiment, each of the plurality of first line identifiers 255 and the plurality of second line identifiers 356 may correspond to a counting pattern or a discriminator. Each of the plurality of first horizontal wirings B1 and the plurality of second horizontal wirings B2 may correspond to a bit line. For example, in an exemplary embodiment, each of the plurality of first line identifiers 255 may be a bit line counting pattern.

The plurality of first horizontal wirings B1 and the plurality of second horizontal wirings B2 may be disposed in parallel with one another. The plurality of first horizontal wirings B1 and the plurality of second horizontal wirings B2 may be arranged (e.g., spaced apart) in a first direction D1 and may each extend in a second direction D2 that intersects with the first direction D1. As shown in the exemplary embodiment of FIG. 1, the second direction D2 may be perpendicular to the first direction D1. However, exemplary embodiments of the present inventive concepts are not limited thereto and the second direction D2 may cross the first direction D1 in various different angles.

In an exemplary embodiment, each of the plurality of first horizontal wirings BJ and the plurality of second horizontal wirings B2 may have substantially the same width (e.g., length in the first direction D1). In an exemplary embodiments, the first wiring group 211 may include a number of first horizontal wirings B1 in a range of about 2 to about 2,000. For example, the first wiring group 211 may include about 2,000 first horizontal wirings B1. The second wiring group 212 may include a number of second horizontal wirings B2 in a range of about 2 to about 2,000. For example, the second wiring group 212 may include about 2,000 second horizontal wirings B2.

One first line identifier 255 selected from among the plurality of first line identifiers 255 may be disposed between the first wiring group 211 and the second wiring group 212 (e.g., in the first direction D1). For example, one first line identifier 255 selected from among the plurality of first line identifiers 255 may be disposed between the plurality of first horizontal wirings B1 and the plurality of second horizontal wirings B2 (e.g., in the first direction D1). One first line identifier 255 selected from among the plurality of first line identifiers 255 may be disposed in a first overlap region disposed between one first horizontal wiring B1 closest thereto among the plurality of first horizontal wirings B1 and one second horizontal wiring B2 closest thereto among the plurality of second horizontal wirings B2. In an exemplary embodiment, one first line identifier 255 selected from among the plurality of first line identifiers 255 may be positioned solely in the first overlap region and may not protrude to the outside of the first overlap region.

The first wiring group 211 and the second wiring group 212 may be disposed adjacent to the page buffer 202 in the second direction D2. The page buffer 202 may be disposed adjacent to the column decoder 204 in the second direction D2. Each of the plurality of first horizontal wirings B1 and the plurality of second horizontal wirings B2 may be connected to the page buffer 202. As shown in the exemplary embodiment of FIG. 1, the plurality of first line identifiers 255 may not be connected to the page buffer 202.

The first wiring group 211 and the second wiring group 212 may be disposed adjacent to the third wiring group 313 and the fourth wiring group 314 in the first direction D1. The plurality of third horizontal wirings X3 and the plurality of fourth horizontal wirings X4 may be disposed in parallel with one another. The plurality of third horizontal wirings X3 and the plurality of fourth horizontal wirings X4 may be arranged (e.g., spaced apart) in the second direction D2. Each of the plurality of third horizontal wirings X3 and the plurality of fourth horizontal wirings X4 may extend in the first direction D1. In an exemplary embodiment, each of the plurality of third horizontal wirings X3 and the plurality of fourth horizontal wirings X4 may have substantially the same width (e.g., length in the second direction D2).

One second line identifier 356 selected from among the plurality of second line identifiers 356 may be disposed between the third wiring group 313 and the fourth wiring group 314 (e.g., in the second direction D2). For example, one second line identifier 356 selected from among the plurality of second line identifiers 356 may be disposed between the plurality of third horizontal wirings X3 and the plurality of fourth horizontal wirings X4 (e.g., in the second direction D2). One second line identifier 356 selected from among the plurality of second line identifiers 356 may be disposed in a second overlap region between one third horizontal wiring X3 closest thereto among the plurality of third horizontal wirings X3 and one fourth horizontal wiring X4 closest thereto among the plurality of fourth horizontal wirings X4. In an exemplary embodiment, one second line identifier 356 selected from among the plurality of second line identifiers 356 may be positioned solely in the second overlap region and may not protrude to the outside of the second overlap region.

The third wiring group 313 and the fourth wiring group 314 may be disposed adjacent to the row decoder 304 in the first direction D1. Each of the plurality of third horizontal wirings X3 and the plurality of fourth horizontal wirings X4 may be connected to the row decoder 304. The plurality of second line identifiers 356 may not be connected to the row decoder 304.

Referring to FIG. 2, semiconductor devices according to exemplary embodiments of the present inventive concepts may include a memory cell array 100, a page buffer 202, a column decoder 204, and a row decoder 304. As illustrated in the exemplary embodiment of FIG. 1, the first wiring group 211, the second wiring group 212, the third wiring group 313, and the fourth wiring group 314 may be disposed in the memory cell array 100.

As shown in the exemplary embodiments of FIGS. 1-2, the memory cell array 100 may be disposed adjacent to the row decoder 304 in the first direction D1. The memory cell array 100 may be disposed adjacent to the column decoder 204 in the second direction D2. The page buffer 202 may be disposed between the memory cell array 100 and the column decoder 204 (e.g., in the second direction D2). In an exemplary embodiment, the column decoder 204 may correspond to a Y-decoder. The page buffer 202 may include a plurality of sense amplifiers. The row decoder 304 may correspond to an X-decoder or a word line decoder.

Figure 3:
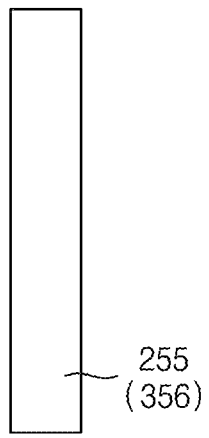
FIGS. 3 to 8 are plan views illustrating some elements of FIG. 1 according to exemplary embodiments of the present inventive concepts.
Figure 4:
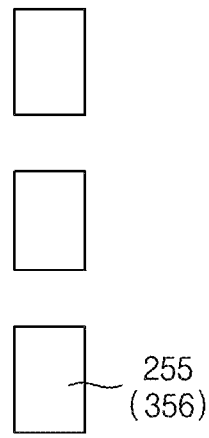
Figure 5:
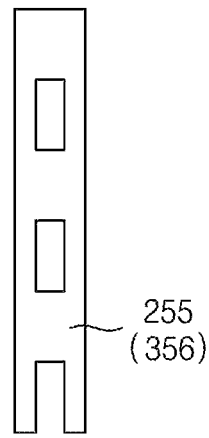
Figure 6:
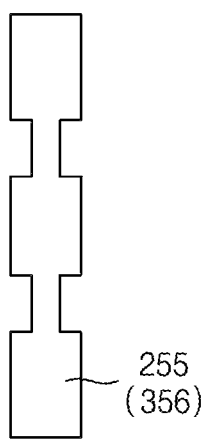
Figure 7:
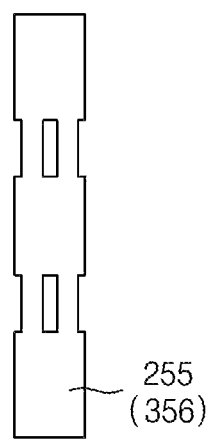
Figure 8:
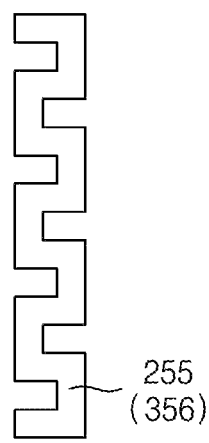

Referring to the exemplary embodiments of FIGS. 3 to 8, each of the plurality of first line identifiers 255 and the plurality of second line identifiers 356 may have a bar shape as shown in FIG. 3, a block shape as shown in FIG. 4, a shape that includes a combination of a bar shape and a plurality of empty spaces as shown in FIGS. 5, 7, a plurality of block shapes having connecting portions for connection therebetween as shown in FIG. 6, a chain shape as shown in FIG. 8, or various sizes and shapes such as a combination thereof.

Referring to FIG. 9, semiconductor devices according to exemplary embodiments of the present inventive concepts may include a substrate 51, a lower horizontal wiring 71, a connection electrode layer 73, a supporter 75, a stacked structure 85, a plurality of channel structures 99, a first upper insulation layer 103, a second upper insulation layer 105, a third upper insulation layer 106, a plurality of bit plugs 107, a plurality of first horizontal wirings BJ, a plurality of second horizontal wirings B2, and a plurality of first line identifiers 255. The stacked structure 85 may include a plurality of electrode layers 81 and a plurality of insulation layers 83, which are alternately and repeatedly stacked.

The plurality of electrode layers 81 and the plurality of insulation layers 83 may be alternately stacked in a third direction D3 intersecting with the first direction D1 and the second direction D2. For example, as shown in the exemplary embodiment of FIG. 9, the third direction D3 may be perpendicular to the first direction D1 and the second direction D2 and may be a thickness direction of the substrate 51. Each of the plurality of channel structures 99 may extend in the third direction D3. Each of the plurality of first horizontal wirings B1 and the plurality of second horizontal wirings B2 may be connected to at least one of a corresponding channel structure of the plurality of channel structures 99 via the plurality of bit plugs 107. The plurality of first line identifiers 255 may not electrically be connected to the plurality of channel structures 99. For example, as shown in the exemplary embodiment of FIG. 9, the semiconductor device does not include any bit plugs 107 disposed between the plurality of first line identifiers 255 and the plurality of channel structures 99 (e.g., in the third direction D3). The plurality of first line identifiers 255 may be insulated from the plurality of channel structures 99. The first upper insulation layer 103 and the second upper insulation layer 105 may be disposed between the plurality of first line identifiers 255 and the plurality of channel structures 99 (e.g., in the third direction D3).

In an exemplary embodiment, the plurality of first horizontal wirings B1 may have a first pitch P1. Each of the plurality of first horizontal wirings B1 may have substantially the same first horizontal width W1 (e.g., length in the first direction D1). An interval between the plurality of first horizontal wirings B1 (e.g., a length that adjacent first horizontal wirings B1 are spaced apart from each other in the first direction D1) may be a first interval D11. The first pitch P1 may be equal to a sum of the first horizontal width W1 and the first interval D11. The plurality of second horizontal wirings B2 may have a second pitch P2. Each of the plurality of second horizontal wirings B2 may have substantially the same second horizontal width W2 (e.g., length in the first direction D1). An interval (e.g., a length that adjacent second horizontal wirings B2 are spaced apart from each other in the first direction D1) between the plurality of second horizontal wirings B2 may be a second interval D22. The second pitch P2 may be equal to a sum of the second horizontal width W2 and the second interval D22. In an exemplary embodiment, the second horizontal width W2 may be substantially the same as the first horizontal width W1. The second pitch P2 may be substantially the same as the first pitch P1. However, exemplary embodiments of the present inventive concepts are not limited thereto.

The plurality of first line identifiers 255 may be disposed at substantially the same level (e.g., length in the third direction D3 from an upper surface of the substrate 51) as the plurality of first horizontal wirings B1 and the plurality of second horizontal wirings B2. In an exemplary embodiment, the plurality of first line identifiers 255, the plurality of first horizontal wirings B1, and the plurality of second horizontal wirings B2 may include the same materials and may be formed substantially simultaneously. Each of the plurality of first line identifiers 255, the plurality of first horizontal wirings B1, and the plurality of second horizontal wirings B2 may have substantially the same thickness (e.g., length in the third direction D3). In an exemplary embodiment, the plurality of first line identifiers 255, the plurality of first horizontal wirings B1, and the plurality of second horizontal wirings B2 may include metal, metal nitride, metal oxide, metal silicide, conductive carbon, polysilicon, or a conductive layer such as a combination thereof. Top surfaces of the plurality of first line identifiers 255, the plurality of first horizontal wirings B1, and the plurality of second horizontal wirings B2 may be substantially coplanar with one another (e.g., in the third direction D3). Bottom surfaces of the plurality of first line identifiers 255, the plurality of first horizontal wirings B1, and the plurality of second horizontal wirings B2 may be substantially coplanar with one another (e.g., in the third direction D3).

In an exemplary embodiment, the plurality of first line identifiers 255 may include a material which differs from those of the plurality of first horizontal wirings B1 and the plurality of second horizontal wirings B2. In an exemplary embodiment, the plurality of first line identifiers 255 may include an empty space. In an exemplary embodiment, the plurality of first line identifiers 255 and the third upper insulation layer 106 may include the same materials and may be formed simultaneously. The plurality of first line identifiers 255 may include an insulation layer.

Each of the plurality of first line identifiers 255 may have a third horizontal width W3 (e.g., length in the first direction D1). As shown in the exemplary embodiment of FIG. 9, the third horizontal width W3 may be greater than the first horizontal width W1 or the second horizontal width W2. In an exemplary embodiment, the third horizontal width W3 may be in a range of about 2 to about 20 times greater than the size of the first horizontal width W1. For example, the third horizontal width W3 may be about 300 nm. In an exemplary embodiment, the first horizontal width W1 may be in a range of about 15 nm to about 150 nm. An interval between a lateral edge of one first line identifier 255 selected from among the plurality of first line identifiers 255 and an adjacent lateral edge of one first horizontal wiring B1 closest thereto among the plurality of first horizontal wirings B1 may be a third interval D31. In an exemplary embodiment, the third interval D31 may be substantially the same as the first interval D11. An interval between a lateral edge of one first line identifier 255 selected from among the plurality of first line identifiers 255 and an adjacent lateral edge of one second horizontal wiring B2 closest thereto among the plurality of second horizontal wirings B2 may be a fourth interval D32. In an exemplary embodiment, the fourth interval D32 may be substantially the same as the second interval D22. In an exemplary embodiment, the first interval D11, the second interval D22, the third interval D31, and the fourth interval D32 may be substantially the same.

In an exemplary embodiment, the lower horizontal wiring 71 may correspond to a source line or a common source line (CSL). At least one of the plurality of electrode layers 81 which is adjacent to a lowermost end of the stacked structure 85 and at least one of the plurality of electrode layers 81 which is adjacent to an uppermost end of the stacked structure 85 may each correspond to a gate-induced drain leakage (GIDL) control line. Some of the plurality of electrode layers 81 may each correspond to a word line or a dummy word line. At least one of the plurality of electrode layers 81 which is adjacent to the lowermost end of the stacked structure 85 and is disposed between the GIDL control line and the word line (e.g., in the third direction D3) may correspond to a ground selection line (GSL). At least one of the plurality of electrode layers 81 which is adjacent to the uppermost end of the stacked structure 85 and is disposed between the GIDL control line and the word line (e.g., in the third direction D3) may correspond to a string selection line (SSL).

The lower horizontal wiring 71 may be disposed on the substrate 51. For example, as shown in the exemplary embodiment of FIG. 9, a lower surface of the lower horizontal wiring 71 may directly contact an upper surface of the substrate 51. In an exemplary embodiment, the substrate 51 may include a semiconductor substrate such as a silicon wafer. The lower horizontal wiring 71 may include a single layer or a multilayer. In an exemplary embodiment, the lower horizontal wiring 71 may include metal, metal nitride, metal silicide, metal oxide, conductive carbon, polysilicon, or a combination thereof. For example, the lower horizontal wiring 71 may include a doped polysilicon layer. In an exemplary embodiment, the lower horizontal wiring 71 may be formed by implanting N-type or P-type impurities into the substrate 51. The connection electrode layer 73 and the supporter 75 may be disposed on the lower horizontal wiring 71. The connection electrode layer 73 may be disposed between the lower horizontal wiring 71 and the supporter 75. For example, as shown in the exemplary embodiment of FIG. 9, an upper surface of the lower horizontal wiring 71 may directly contact a lower surface of the connection electrode layer 73 and a lower surface of the supporter 75 may directly contact an upper surface of the connection electrode layer 73.

The stacked structure 85 may be disposed on the supporter 75. For example, a lower surface of the stacked structure 85 may directly contact an upper surface of the supporter 75. In an exemplary embodiment, the plurality of electrode layers 81 may include metal, metal nitride, metal silicide, metal oxide, conductive carbon, polysilicon, or a combination thereof. In an exemplary embodiment, the plurality of insulation layers 83 may include silicon oxide, silicon nitride, silicon oxynitride, silicon boron nitride (SiBN), silicon carbon nitride (SiCN), low-k dielectrics, high-k dielectrics, or a combination thereof. For example, the plurality of insulation layers 83 may include silicon oxide. Each of the plurality of channel structures 99 may pass through the stacked structure 85, the supporter 75, and the connection electrode layer 73 and may extend to an inner portion of the lower horizontal wiring 71. For example, as shown in the exemplary embodiment of FIG. 9, a lower surface of the plurality of channel structures 99 may extend below (e.g., in the third direction D3) an upper surface of the lower horizontal wiring 71.

The first upper insulation layer 103 may be disposed on the stacked structure 85. For example, as shown in the exemplary embodiment of FIG. 9, a lower surface of the first upper insulation layer 103 may directly contact an upper surface of the stacked structure 85. The second upper insulation layer 105 may be disposed on the first upper insulation layer 103. For example, as shown in the exemplary embodiment of FIG. 9, a lower surface of the second upper insulation layer 105 may directly contact an upper surface of the first upper insulation layer 103. The plurality of bit plugs 107 are formed to contact a lower surface of the first and second horizontal wirings B1, B2, to pass through the second upper insulation layer 105 and the first upper insulation layer 103 and to directly contact an upper surface of the plurality of channel structures 99. The plurality of first horizontal wirings B1, the plurality of second horizontal wirings B2, and the plurality of first line identifiers 255 may be disposed on the second upper insulation layer 105. For example, as shown in the exemplary embodiment of FIG. 9, lower surfaces of the plurality of first horizontal wirings B1, the plurality of second horizontal wirings B2, and the plurality of first line identifiers 255 may directly contact an upper surface of the second upper insulation layer 105. The third upper insulation layer 106 covering the plurality of first horizontal wirings B1, the plurality of second horizontal wirings B2, and the plurality of first line identifiers 255 may be disposed on the second upper insulation layer 105. For example, as shown in the exemplary embodiment of FIG. 9, a lower surface of the third upper insulation layer 106 may directly contact upper and lateral side surfaces of the first horizontal wirings B1, the plurality of second horizontal wirings B2, and the plurality of first line identifiers 255 and an upper surface of the second upper insulation layer 105.

In an exemplary embodiment, the plurality of bit plugs 107 may include metal, metal nitride, metal silicide, metal oxide, conductive carbon, polysilicon, or a combination thereof. In an exemplary embodiment, the first upper insulation layer 103, the second upper insulation layer 105, and the third upper insulation layer 106 may include silicon oxide, silicon nitride, silicon oxynitride, SiBN, SiCN, low-k dielectrics, high-k dielectrics, or a combination thereof.

Referring to FIG. 10, semiconductor devices according to exemplary embodiments of the present inventive concepts may include a substrate 51, a lower horizontal wiring 71, a connection electrode layer 73, a supporter 75, a stacked structure 85, a plurality of isolation patterns 89, a plurality of channel structures 99, a first upper insulation layer 103, a second upper insulation layer 105, a third upper insulation layer 106, a plurality of bit plugs 107, and a plurality of first horizontal wirings B1.

Each of the plurality of isolation patterns 89 may extend in the third direction D3 and may be arranged in the second direction D2. Each of the plurality of isolation patterns 89 may pass through the first upper insulation layer 103, the stacked structure 85, the supporter 75, and the connection electrode layer 73 and may extend to an inner portion of the lower horizontal wiring 71. For example, as shown in the exemplary embodiment of FIG. 10, a lower surface of the plurality of isolation patterns 89 may extend below (e.g., in the third direction D3) an upper surface of the lower horizontal wiring 71. In an exemplary embodiment, the plurality of isolation patterns 89 may include silicon oxide, silicon nitride, silicon oxynitride, SiBN, SiCN, low-k dielectrics, high-k dielectrics, or a combination thereof.

Referring to the exemplary embodiment of FIG. 11, a plurality of channel structures 99 may pass through a stacked structure 85. A first upper insulation layer 103 may cover the stacked structure 85 and the plurality of channel structures 99. A second upper insulation layer 105 may be disposed on the first upper insulation layer 103. A first line identifier 255 may be disposed on the second upper insulation layer 105. The first line identifier 255 may not be electrically connected to the plurality of channel structures 99. The first line identifier 255 may be insulated from the plurality of channel structures 99. The first upper insulation layer 103 and the second upper insulation layer 105 may be disposed between the first line identifier 255 and the plurality of channel structures 99.

Referring to the exemplary embodiment of FIG. 12, a first upper insulation layer 103 may be disposed on a stacked structure 85. A second upper insulation layer 105 may be disposed on the first upper insulation layer 103. A first line identifier 255 may be disposed on the second upper insulation layer 105. As shown in the exemplary embodiment of FIG. 12, in contrast to the exemplary embodiment of FIG. 1 which includes a plurality of channel structures 99, the semiconductor device may not include a plurality of channel structures 99 between the substrate 51 and the first line identifier 255 (e.g., in the third direction D3). The first line identifier 255 may not be electrically connected to a plurality of electrode layers 81 of the stacked structure 85. The first line identifier 255 may be insulated from the plurality of electrode layers 81.

Referring to the exemplary embodiment of FIG. 13, the semiconductor device includes a first dummy contact plug 287 which passes through a first upper insulation layer 103, a stacked structure 85, a supporter 75, and a connection electrode layer 73 and extends to an inner portion of a lower horizontal wiring 71. For example, as shown in the exemplary embodiment of FIG. 13, a lower surface of the first dummy contact plug 287 may extend below an upper surface of the lower horizontal wiring 71. The first dummy contact plug 287 may directly contact the lower horizontal wiring 71. A contact spacer 286 may surround lateral side surfaces of the first dummy contact plug 287. The contact spacer 286 may be disposed between the first dummy contact plug 287 and a plurality of electrode layers 81 and a plurality of insulation layers 83 of the stacked structure 85. The contact spacer 286 may provide an insulation structure between the plurality of electrode layers 81 and the first dummy contact plug 287.

A second dummy contact plug 288 passes through a second upper insulation layer 105 and contacts the first dummy contact plug 287. For example, a lower surface of the second dummy contact plug 288 may directly contact an upper surface of the first dummy contact plug 287. A first line identifier 255 contacting the second dummy contact plug 288 may be disposed on the second upper insulation layer 105. For example, as shown in the exemplary embodiment of FIG. 13, a lower surface of the first line identifier 255 may directly contact an upper surface of the second dummy contact plug 288. The first line identifier 255 may be electrically connected to the lower horizontal wiring 71 via the second dummy contact plug 288 and the first dummy contact plug 287. However, the number of dummy contact plugs may vary in other exemplary embodiments and at least one dummy contact plug may be configured to connect the first line identifier 255 to the lower horizontal wiring 71.

In an exemplary embodiment, the contact spacer 286 may include silicon oxide, silicon nitride, silicon oxynitride, SiBN, SiCN, low-k dielectrics, high-k dielectrics, or a combination thereof. In an exemplary embodiment, each of the first dummy contact plug 287 and the second dummy contact plug 288 may include metal, metal nitride, metal silicide, metal oxide, conductive carbon, polysilicon, or a combination thereof.

Referring to the exemplary embodiment of FIG. 14, a channel structure 99 may include a core pattern 97, a channel layer 96 surrounding an outer portion of the core pattern 97, an information storage pattern 95 surrounding an outer portion of the channel layer 96, and a bit pad 98 disposed on the channel layer 96. As shown in the exemplary embodiment of FIG. 14, the information storage pattern 95 may include a tunnel insulation layer 91 surrounding and directly contacting an outer portion of the channel layer 96, a charge storage layer 92 surrounding and directly contacting an outer portion of the tunnel insulation layer 91, and a blocking layer 93 surrounding and directly contacting an outer portion of the charge storage layer 92. The channel structure 99 may pass through an electrode layer 81 and a plurality of insulation layers 83. A bit plug 107 may pass through a first upper insulation layer 103 and may contact the bit pad 98 of the channel structure 99. For example, as shown in the exemplary embodiment of FIG. 14, a lower surface of the bit plug 107 may directly contact an upper surface of the bit pad 98.

In an exemplary embodiment, the tunnel insulation layer 91 may include an insulation layer such as silicon oxide. The charge storage layer 92 may include an insulation layer such as silicon nitride. The blocking layer 93 may include silicon oxide, silicon nitride, silicon oxynitride, SiBN, SiCN, low-k dielectrics, high-k dielectrics, or a combination thereof. The channel layer 96 may include polysilicon, amorphous silicon, single crystalline silicon, or a semiconductor layer such as a combination thereof. The core pattern 97 may include silicon oxide, silicon nitride, silicon oxynitride, SiBN, SiCN, low-k dielectrics, high-k dielectrics, or a combination thereof. The bit pad 98 may include metal, metal nitride, metal oxide, metal silicide, conductive carbon, polysilicon, or a conductive layer such as a combination thereof.

Referring to the exemplary embodiment of FIG. 15, a plurality of electrode layers 81 and a plurality of insulation layers 83 may be repeatedly and alternately stacked. The channel structure 99 may pass through the plurality of electrode layers 81 and the plurality of insulation layers 83.

The channel structure 99 may include a core pattern 97, a channel layer 96, and an information storage pattern 95. The information storage pattern 95 may include a tunnel insulation layer 91, a charge storage layer 92, and a blocking layer 93.

Referring to the exemplary embodiment of FIG. 16, a connection electrode layer 73 may be disposed between a lower horizontal wiring 71 and a supporter 75. For example, as shown in the exemplary embodiment of FIG. 16, a lower surface of the connection electrode layer 73 may directly contact an upper surface of the lower horizontal wiring 71 and an upper surface of the connection electrode 73 may directly contact a lower surface of the supporter 75. An insulation layer 83 may be disposed on the supporter 75. A channel structure 99 may pass through the insulation layer 83 and the supporter 75 and may extend to an inner portion of the lower horizontal wiring 71. For example, as shown in the exemplary embodiment of FIG. 16, a lower surface of the channel structure 99 may extend below an upper surface of the lower horizontal wiring 71. The connection electrode layer 73 may pass through a side surface of the information storage pattern 95 and may directly contact a lateral side surface of the channel layer 96. A lowermost end of the channel structure 99 may be disposed at a level which is higher than a bottom surface of the lower horizontal wiring 71. The channel layer 96 may be electrically connected to the lower horizontal wiring 71 via the connection electrode layer 73.

Referring to FIG. 17, semiconductor devices according to exemplary embodiments of the present inventive concepts may include a substrate 51, a lower horizontal wiring 71, a connection electrode layer 73, a connection mold layer 73M, a supporter 75, a first lower insulation layer 76, a second lower insulation layer 77, a buried insulation pattern 78, a stacked structure 85, at least one interlayer insulation layer 86, a plurality of channel structures 99, a first upper insulation layer 103, a second upper insulation layer 105, a third upper insulation layer 106, a plurality of bit plugs 107, a first contact plug 307, a second contact plug 308, a third contact plug 309, a plurality of first horizontal wirings B1, a plurality of second horizontal wirings B2, and a third horizontal wiring X3. The connection electrode layer 73 and the connection mold layer 73M may form a connection wiring layer.

The lower horizontal wiring 71 and the first lower insulation layer 76 may be disposed on the substrate 51. For example, as shown in the exemplary embodiment of FIG. 17, lower surfaces of the lower horizontal wiring 71 and the first lower insulation layer 76 may directly contact an upper surface of the substrate 51 and may be arranged in the first direction D1 with respect to each other. Top surfaces of the lower horizontal wiring 71 and the first lower insulation layer 76 may be substantially coplanar with each other (e.g., in the third direction D3). The connection mold layer 73M, the connection electrode layer 73, the supporter 75, the second lower insulation layer 77, and the buried insulation pattern 78 may be disposed on the lower horizontal wiring 71 and the first lower insulation layer 76.

In an exemplary embodiment, the connection mold layer 73M may include a material having an etch selectivity with respect to the lower horizontal wiring 71 and the supporter 75. The connection mold layer 73M may include a lower mold layer 73L, an upper mold layer 73U disposed on the lower mold layer 73L, and a middle mold layer 73C disposed between the lower mold layer 73L and the upper mold layer 73U (e.g., in the third direction D3). The middle mold layer 73C may include a material having an etch selectivity with respect to the lower mold layer 73L and the upper mold layer 73U. For example, in an exemplary embodiment, each of the lower mold layer 73L and the upper mold layer 73U may include silicon oxide. The middle mold layer 73C may include silicon nitride.

The supporter 75 may cover the connection mold layer 73M and the connection electrode layer 73. The supporter 75 may include a portion that passes through the connection mold layer 73M and the connection electrode layer 73 and may directly contact a top surface of the lower horizontal wiring 71. As shown in the exemplary embodiment of FIG. 17, the supporter 75 may directly contact a top surface and lateral side surface of the connection mold layer 73M and a top surface and lateral end of the connection electrode layer 73. A lateral end of the second lower insulation layer 77 may contact a lateral end of the supporter 75 and a lateral end of the connection mold layer 73M. A buried insulation pattern 78 may be disposed on the supporter 75.

Top surfaces of the supporter 75, the second lower insulation layer 77, and the buried insulation pattern 78 may be exposed and be substantially co-planar with each other (e.g., in the third direction D3). In an exemplary embodiment, each of the first lower insulation layer 76, the second lower insulation layer 77, and the buried insulation pattern 78 may include silicon oxide, silicon nitride, silicon oxynitride, SiBN, SiCN, low-k dielectrics, high-k dielectrics, or a combination thereof. In an exemplary embodiment, the supporter 75 may include a polysilicon layer. The connection electrode layer 73 may include metal, metal nitride, metal oxide, metal silicide, conductive carbon, polysilicon, or a conductive layer such as a combination thereof.

The stacked structure 85 and the interlayer insulation layer 86 may be disposed on the supporter 75, the second lower insulation layer 77, and the buried insulation pattern 78 (e.g., in the third direction D3). The interlayer insulation layer 86 may be disposed on lateral side surfaces of the stacked structure 85. In an exemplary embodiment, the interlayer insulation layer 86 may include silicon oxide, silicon nitride, silicon oxynitride, SiBN, SiCN, low-k dielectrics, high-k dielectrics, or a combination thereof.

The first upper insulation layer 103, the second upper insulation layer 105, and the third upper insulation layer 106 may be sequentially stacked on the stacked structure 85 and the interlayer insulation layer 86 (e.g., in the third direction D3). The first contact plug 307 may extend substantially in the third direction D3 and pass through the first upper insulation layer 103 and the interlayer insulation layer 86 and may contact corresponding one of a plurality of electrode layers 81. The second contact plug 308 may extend substantially in the third direction D3 and pass through the second upper insulation layer 105 and may contact the first contact plug 307. For example, as shown in the exemplary embodiment of FIG. 17, a lower surface of the second contact plug 308 may directly contact an upper surface of the first contact plug 307. The third contact plug 309 may extend substantially in the third direction D3 and pass through the third upper insulation layer 106 and may contact the second contact plug 308. For example, as shown in the exemplary embodiment of FIG. 17, a lower surface of the third contact plug 309 may directly contact an upper surface of the second contact plug 308. The third horizontal wiring X3 may be disposed on the third upper insulation layer 106 and may contact the third contact plug 309. For example, as shown in the exemplary embodiment of FIG. 17, a lower surface of the third horizontal wiring X3 may directly contact an upper surface of the third contact plug 309. However, exemplary embodiments of the present inventive concepts are not limited thereto. The third horizontal wiring X3 may contact corresponding one of a plurality of electrode layers 81 via the third contact plug 309, the second contact plug 308, and the first contact plug 307. In an exemplary embodiment, each of the first contact plug 307 the second contact plug 308, the third contact plug 309, and the third horizontal wiring X3 may include metal, metal nitride, metal oxide, metal silicide, conductive carbon, polysilicon, or a conductive layer such as a combination thereof.

The third horizontal wiring X3 may be disposed at a level which differs from the plurality of first horizontal wirings B1 and the plurality of second horizontal wirings B2. For example, as shown in the exemplary embodiment of FIG. 17, the third horizontal wiring X3 may be formed at a level which is higher than the plurality of first horizontal wirings B1 and the plurality of second horizontal wirings B2. In an exemplary embodiment, the third horizontal wiring X3 may be disposed on the third upper insulation layer 106. For example, as shown in the exemplary embodiment of FIG. 17, a lower surface of the third horizontal wiring X3 may directly contact an upper surface of the third upper insulation layer 106. The plurality of first horizontal wirings B1 and the plurality of second horizontal wirings B2 may be formed in the third upper insulation layer 106. For example, the third upper insulation layer 106 may directly contact upper and lateral side surfaces of the plurality of first horizontal wirings B1 and the plurality of second horizontal wirings B2.

Referring to FIG. 18, semiconductor devices according to exemplary embodiments of the present inventive concepts may include a substrate 51, a first lower insulation layer 76, a second lower insulation layer 77, at least one interlayer insulation layer 86, a first upper insulation layer 103, a second upper insulation layer 105, a third upper insulation layer 106, a third wiring group 313 including a plurality of third horizontal wirings X3, a fourth wiring group 314 including a plurality of fourth horizontal wirings X4, and a plurality of second line identifiers 356.

The plurality of third horizontal wirings X3, the plurality of fourth horizontal wirings X4, and the plurality of second line identifiers 356 may be disposed on the third upper insulation layer 106. For example, as shown in the exemplary embodiment of FIG. 18, lower surfaces of the plurality of third horizontal wirings X3, the plurality of fourth horizontal wirings X4, and the plurality of second line identifiers 356 may directly contact an upper surface of the third upper insulation layer 106. Each of the plurality of third horizontal wirings X3 may have substantially the same horizontal width (e.g., length in the second direction D2). Each of the plurality of third horizontal wirings X3 may have substantially the same interval between a corresponding third horizontal wiring X3 and an adjacent third horizontal wiring X3 (e.g., length in the second direction D2 that each third horizontal wiring X3 is spaced apart from an adjacent third horizontal wiring X3). Each of the plurality of fourth horizontal wirings X4 may have substantially the same horizontal width (e.g., length in the second direction D2). Each of the plurality of fourth horizontal wirings X4 may have substantially the same interval between a corresponding fourth horizontal wiring X4 and an adjacent fourth horizontal wiring X4 (e.g., length in the second direction D2 that each fourth horizontal wiring X4 is spaced apart from an adjacent fourth horizontal wiring X4). In an exemplary embodiment, the plurality of third horizontal wirings X3 may have substantially the same pitch as the plurality of fourth horizontal wirings X4.

The plurality of second line identifiers 356 may be disposed at substantially the same level as the plurality of third horizontal wirings X3 and the plurality of fourth horizontal wirings X4. In an exemplary embodiment, the plurality of second line identifiers 356, the plurality of third horizontal wirings X3, and the plurality of fourth horizontal wirings X4 may include the same materials which are formed substantially simultaneously. Each of the plurality of second line identifiers 356, the plurality of third horizontal wirings X3, and the plurality of fourth horizontal wirings X4 may have substantially the same thickness (e.g., length in the third direction D3). In an exemplary embodiment, the plurality of second line identifiers 356, the plurality of third horizontal wirings X3, and the plurality of fourth horizontal wirings X4 may include metal, metal nitride, metal oxide, metal silicide, conductive carbon, polysilicon, or a conductive layer such as a combination thereof. Top surfaces of the plurality of second line identifiers 356, the plurality of third horizontal wirings X3, and the plurality of fourth horizontal wirings X4 may be substantially coplanar with one another (e.g., in the third direction D3). Bottom surfaces of the plurality of second line identifiers 356, the plurality of third horizontal wirings X3, and the plurality of fourth horizontal wirings X4 may be substantially coplanar with one another (e.g., in the third direction D3).

In an exemplary embodiment, the plurality of second line identifiers 356 may include a material that differs from those of the plurality of third horizontal wirings X3 and the plurality of fourth horizontal wirings X4. In an exemplary embodiment, the plurality of second line identifiers 356 may include an empty space. The plurality of second line identifiers 356 may include an insulation layer.

Each of the plurality of second line identifiers 356 may have a horizontal width (e.g., length in the second direction D2) which is greater than the horizontal width of each of the plurality of third horizontal wirings X3 and the plurality of fourth horizontal wirings X4. In an exemplary embodiment, a horizontal width of each of the plurality of second line identifiers 356 may be in a range of about 2 to about 20 times greater than a horizontal width of each of the plurality of third horizontal wirings X3 and the plurality of fourth horizontal wirings X4. For example, a horizontal width of each of the plurality of second line identifiers 356 may be about 300 nm. In an exemplary embodiment, the horizontal width of each of the plurality of third horizontal wirings X3 and the plurality of fourth horizontal wirings X4 may be in a range of about 15 nm to about 150 nm. An interval between one second line identifier 356 selected from among the plurality of second line identifiers 356 and one third horizontal wiring X3 immediately adjacent thereto (e.g., in the second direction D2) among the plurality of third horizontal wirings X3 may be substantially the same as an interval between immediately adjacent third horizontal wirings X3 of the plurality of third horizontal wirings X3. An interval between one second line identifier 356 selected from among the plurality of second line identifiers 356 and one fourth horizontal wiring X4 immediately adjacent thereto (e.g., in the second direction D2) among the plurality of fourth horizontal wirings X4 may be substantially the same as an interval between the plurality of fourth horizontal wirings X4.

Referring again to the exemplary embodiments of FIGS. 1, 17, and 18, each of the plurality of third horizontal wirings X3 and the plurality of fourth horizontal wirings X4 may be connected to a corresponding one of the plurality of electrode layers 81 via the third contact plug 309, the second contact plug 308, and the first contact plug 307. The plurality of second line identifiers 356 may not be electrically connected to the plurality of electrode layers 81. The plurality of third horizontal wirings X3, the plurality of fourth horizontal wirings X4, and the plurality of second line identifiers 356 may be formed at a level which differs from the plurality of first horizontal wirings B1, the plurality of second horizontal wirings B2, and the plurality of first line identifiers 255. In an exemplary embodiment, the plurality of third horizontal wirings X3, the plurality of fourth horizontal wirings X4, and the plurality of second line identifiers 356 may be disposed on the third upper insulation layer 106. For example, as shown in the exemplary embodiment of FIG. 18, a lower surface of the plurality of third horizontal wirings X3, the plurality of fourth horizontal wirings X4, and the plurality of second line identifiers 356 may directly contact an upper surface of the third upper insulation layer 106. The plurality of first horizontal wirings B1, the plurality of second horizontal wirings B2, and the plurality of first line identifiers 255 may be formed in the third upper insulation layer 106 and are disposed below an upper surface of the third upper insulation layer 106.

Figure 19:
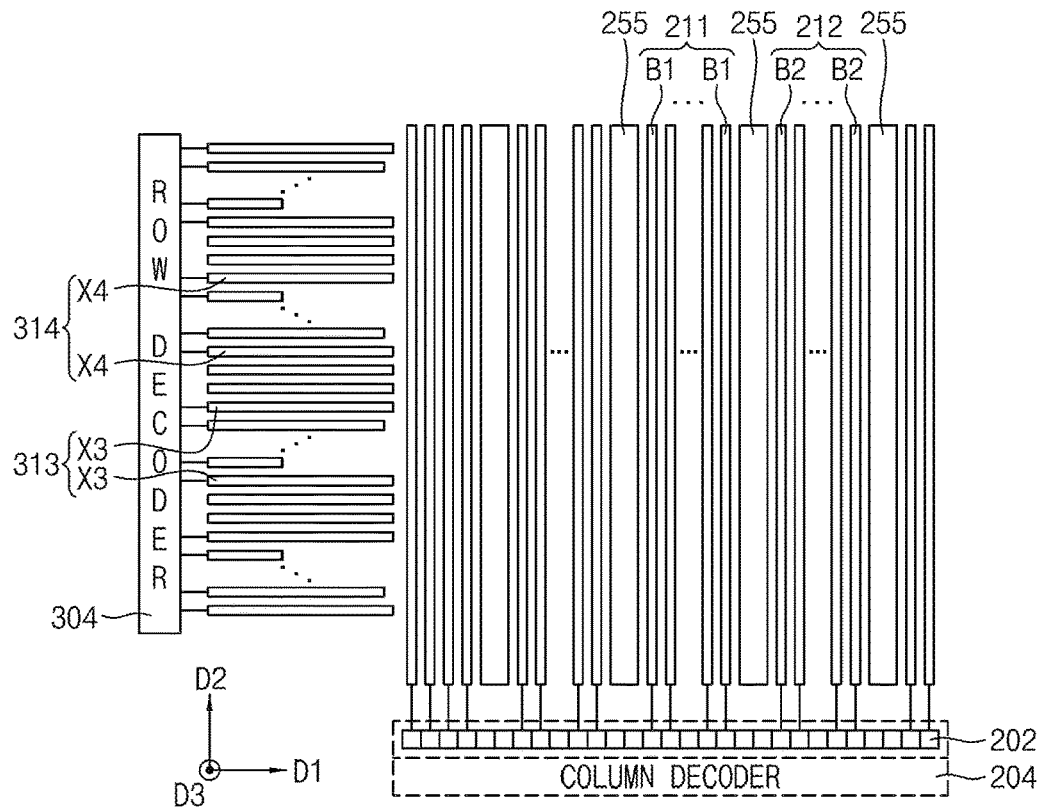
FIGS. 19 and 20 are schematic views of semiconductor devices according to exemplary embodiments of the present inventive concepts.
Figure 20:
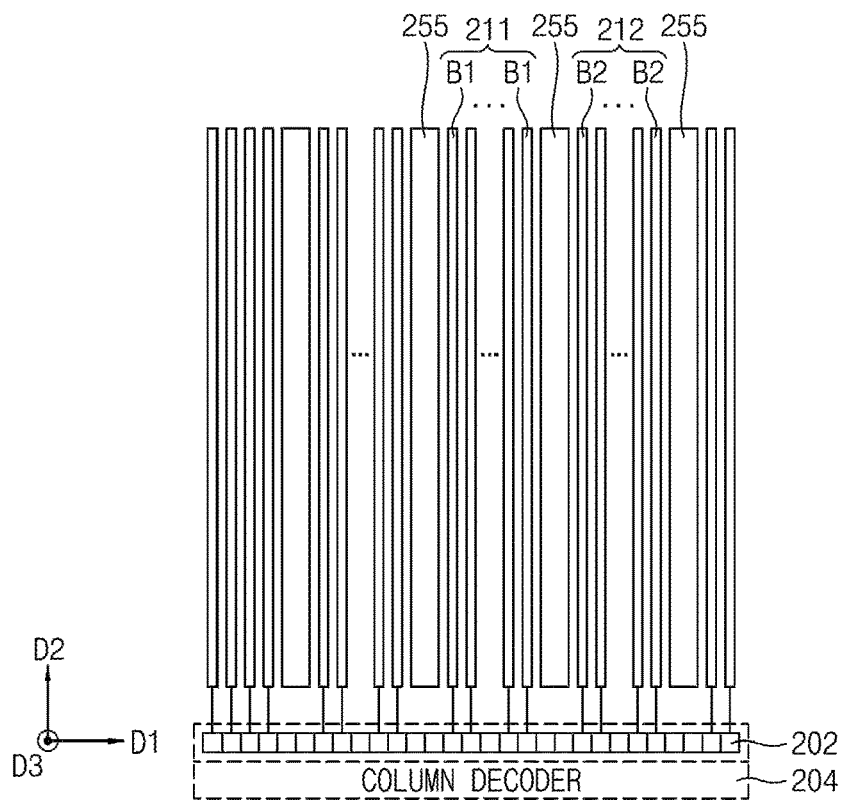

FIGS. 19 and 20 are schematic views for describing semiconductor devices according to exemplary embodiments of the present inventive concepts.

Referring to the FIG. 19, semiconductor devices according to exemplary embodiments of the present inventive concepts may include a page buffer 202, a column decoder 204, a row decoder 304, a first wiring group 211 including a plurality of first horizontal wirings B1, a second wiring group 212 including a plurality of second horizontal wirings B2, a plurality of first line identifiers 255, a third wiring group 313 including a plurality of third horizontal wirings X3, and a fourth wiring group 314 including a plurality of fourth horizontal wirings X4.

The plurality of first horizontal wirings B1 and the plurality of second horizontal wirings B2 may be arranged in the first direction D1. Each of the plurality of first horizontal wirings B1 and the plurality of second horizontal wirings B2 may extend in the second direction D2. One first line identifier 255 selected from among the plurality of first line identifiers 255 may be disposed between the first wiring group 211 and the second wiring group 212 (e.g., in the first direction D1).

The first wiring group 211 and the second wiring group 212 may be disposed adjacent to the third wiring group 313 and the fourth wiring group 314 in the first direction D1. The plurality of third horizontal wirings X3 and the plurality of fourth horizontal wirings X4 may be arranged in the second direction D2. Each of the plurality of third horizontal wirings X3 and the plurality of fourth horizontal wirings X4 may extend in the first direction D. In an exemplary embodiment, each of the plurality of third horizontal wirings X3 and the plurality of fourth horizontal wirings X4 may have substantially the same width (e.g., length in the second direction D2).

The third wiring group 313 and the fourth wiring group 314 may be disposed adjacent to the row decoder 304 in the first direction D1. Each of the plurality of third horizontal wirings X3 and the plurality of fourth horizontal wirings X4 may be connected to the row decoder 304.

Referring to FIG. 20, semiconductor devices according to exemplary embodiments of the present inventive concepts may include a page buffer 202, a column decoder 204, a first wiring group 211 including a plurality of first horizontal wirings B1, a second wiring group 212 including a plurality of second horizontal wirings B2, and a plurality of first line identifiers 255.

The plurality of first horizontal wirings B1 and the plurality of second horizontal wirings B2 may be arranged in the first direction D1. Each of the plurality of first horizontal wirings B1 and the plurality of second horizontal wirings B2 may extend in a second direction D2. One first line identifier 255 selected from among the plurality of first line identifiers 255 may be disposed between the first wiring group 211 and the second wiring group 212 (e.g., in the first direction D1).

According to exemplary embodiments of the present inventive concepts, a line identifier may be provided between a plurality of horizontal wirings. Semiconductor devices for enabling a position of each of a plurality of wirings parallel to one another to be easily identified may be implemented.

Hereinabove, exemplary embodiments of the present inventive concepts have been described with reference to the accompanying drawings, but it may be understood that those skilled in the art may implement exemplary embodiments in another detailed form without changing the present inventive concepts or the essential features. It should be understood that exemplary embodiments described above are merely examples in all aspects and the present inventive concepts are not limited thereby.

What is claimed is:

1. A semiconductor device comprising:
a lower horizontal pattern;
a stacked structure disposed on the lower horizontal pattern, the stacked structure including a plurality of insulation layers and a plurality of gate electrode layers;
a plurality of channel structures extending through the stacked structure;
a first bit line group including a plurality of first bit lines disposed on the stacked structure, the plurality of first bit lines is arranged in a first direction and extends in a second direction intersecting with the first direction, and each of the plurality of first bit lines is electrically connected to corresponding one of the plurality of channel structures;
a second bit line group including a plurality of second bit lines disposed on the stacked structure, the plurality of second bit lines is arranged in the first direction and extends in the second direction, and each of the plurality of second bit lines is electrically connected to corresponding one of the plurality of channel structures;
a first line identifier disposed between the first bit line group and the second bit line group, the first line identifier is adjacent to a first bit line of the plurality of first bit lines and a second bit line of the plurality of second bit lines; and
at least one contact plug disposed between the first line identifier and the lower horizontal pattern,
wherein the plurality of insulation layers and the plurality of gate electrode layers are alternately stacked in a third direction intersecting with the first direction and the second direction, and
wherein each of the plurality of channel structures extends in the third direction,
wherein the first line identifier is at the same level as the plurality of first bit lines and the plurality of second bit lines,
wherein a first distance between the first bit line group and the second bit line group is greater than a second distance between first bit lines adjacent to each other among the plurality of first bit lines, wherein at least one gate electrode layer of the plurality of gate electrode layers vertically overlaps with the plurality of first bit lines, the first line identifier, and the plurality of second bit lines, and wherein the at least one contact plug is configured to connect the first line identifier to the lower horizontal pattern.

2. The semiconductor device of claim 1, wherein the first line identifier is insulated from the plurality of channel structures, wherein the plurality of channel structures include:

first channel structures electrically connected to the plurality of first bit lines;

second channel structures electrically connected to the plurality of second bit lines; and third channel structures vertically overlapping with the first line identifier and not electrically connected to the first line identifier.

3. The semiconductor device of claim 2, further comprising a plurality of plugs, wherein the plurality of plugs are electrically connected to the first channel structures and the second channel structures, and are not electrically connected to the third channel structures, and wherein the plurality of plugs include:

first plugs electrically connecting the plurality of first bit lines to the first channel structures; and second plugs electrically connecting the plurality of second bit lines to the second channel structures.

4. The semiconductor device of claim 1, wherein the first line identifier has a line shape extending in the second direction, and wherein the first line identifier comprises a same metal material as a material of each of the plurality of first bit lines and the plurality of second bit lines.

5. The semiconductor device of claim 1, further comprising a semiconductor substrate, wherein the lower horizontal pattern on the semiconductor substrate, wherein each of the plurality of channel structures contacts the lower horizontal pattern, and wherein the lower horizontal pattern includes doped polysilicon.

6. The semiconductor device of claim 5, further comprising a connection layer between the lower horizontal pattern and the stacked structure, wherein each of the plurality of channel structures includes a channel layer contacting the connection layer, and wherein the connection layer includes polysilicon.

7. The semiconductor device of claim 1, wherein the first line identifier has a horizontal width that differs from a horizontal width of each of the plurality of first bit lines and the plurality of second bit lines.

8. The semiconductor device of claim 1, wherein the first line identifier has a horizontal width that is in a range of about 2 to about 20 times greater than a horizontal width of each of the plurality of first bit lines and the plurality of second bit lines.

9. The semiconductor device of claim 1, wherein the first line identifier is positioned solely in a first overlap region disposed between one first bit line that is closest to the first line identifier among the plurality of first bit lines and one second bit line that is closest to the first line identifier among the plurality of second bit lines.

10. The semiconductor device of claim 1, further comprising:

horizontal wirings electrically connected to the gate electrode layers by gate contact plugs and vertically overlapping with the stacked structure, wherein a length in the second direction of a group of the horizontal wirings vertically overlapping with the stacked structure is smaller than a length in the second direction of each of the bit lines, and wherein the width in the second direction of the group of the horizontal wirings vertically overlapping with the stacked structure is smaller than a length in the second direction of the first line identifier.

11. A semiconductor device comprising:

a lower horizontal pattern including a common source;

a stacked structure including a plurality of insulation layers and a plurality of gate electrode layers disposed on the lower horizontal pattern;

a plurality of channel structures passing through the stacked structure and contacting the common source;

a first bit line group including a plurality of first bit lines disposed on the stacked structure, the plurality of first bit lines is arranged in a first direction and extends in a second direction intersecting with the first direction, and each of the plurality of first bit lines is electrically connected to corresponding one of the plurality of channel structures;

a second bit line group including a plurality of second bit lines disposed on the stacked structure, the plurality of second bit lines is arranged in the first direction and extends in the second direction, and each of the plurality of second bit lines is electrically connected to corresponding one of the plurality of channel structures;

a first line identifier disposed between the first bit line group and the second bit line group, the first line identifier is adjacent to a first bit line of the plurality of first bit lines and a second bit line of the plurality of second bit lines;

a third bit line group including a plurality of third bit lines, the plurality of third bit lines is arranged in the first direction and extends in the second direction, and each of the plurality of third bit lines is electrically connected to corresponding one of the plurality of channel structures;

a fourth bit line group including a plurality of fourth bit lines, the plurality of fourth bit lines is arranged in the first direction and extends in the second direction, and each of the plurality of fourth bit lines is electrically connected to corresponding one of the plurality of channel structures, wherein the plurality of insulation layers and the plurality of gate electrode layers are alternately stacked in a third direction intersecting with the first direction and the second direction;

a second line identifier disposed between the third bit line group and the fourth bit line group, the second line identifier is adjacent to a third bit line of the plurality of third bit lines and a fourth bit line of the plurality of fourth bit lines; and at least one contact plug disposed between the lower horizontal pattern and at least one of the first and second line identifiers, wherein each of the plurality of channel structures extends in the third direction, wherein a distance between the first bit line group and the second bit line group is greater than a distance between first bit lines adjacent to each other among the plurality of first bit lines, wherein at least one gate electrode layer of the plurality of gate electrode layers vertically overlaps with the plurality of first bit lines, the first line identifier, the plurality of second bit lines, the plurality of third bit lines, the second line identifier, and the plurality of fourth bit lines, and wherein the at least one contact plug is configured to connect the at least one of the first and second line identifiers to the common source.

12. The semiconductor device of claim 11, wherein the plurality of first bit lines, the plurality of second bit lines, the plurality of third bit lines, and the plurality of fourth bit lines vertically overlaps with the plurality of channel structures, wherein the first and second line identifiers vertically overlap with the plurality of gate electrode layers, do not vertically overlap with the plurality of channel structures, and are not electrically connected to the plurality of gate electrode layer.

13. The semiconductor device of claim 11, further comprising:

horizontal wirings electrically connected to the gate electrode layers by gate contact plugs and vertically overlapping with the stacked structure, wherein a length in the second direction of a group of the horizontal wirings vertically overlapping with the stacked structure is smaller than a length in the second direction of each of the bit lines, and wherein the length in the second direction of the group of the horizontal wirings vertically overlapping with the stacked structure is smaller than a length in the second direction of the first line identifier.

14. The semiconductor device of claim 11, wherein a number of the first bit lines of the first bit line group is the same as a number of the second bit lines of the second bit line group, and wherein a width of each of the first and second line identifiers is greater than a width of each of the first, second, third, and fourth bit lines.

15. A semiconductor device comprising:

a stacked structure including insulation layers and gate electrode layers alternately stacked in a vertical direction;

channel structures penetrating through the stacked structure in the vertical direction, wherein each of the channel structures includes a channel layer; and bit line groups and conductive line patterns alternately arranged in a first direction perpendicular to the vertical direction and on the stacked structure, wherein the conductive line patterns include a first conductive line pattern, a second conductive line pattern, and a third conductive line pattern sequentially arranged in the first direction, wherein the bit line groups include:

a first bit line group between the first conductive line pattern and the second conductive line pattern; and a second bit line group between the second conductive line pattern and the third conductive line pattern, wherein each of the bit line groups includes bit lines spaced apart from each other in the first direction, wherein the conductive line patterns are substantially at the same level as the bit lines, wherein each of the bit lines has a line shape extending in a second direction perpendicular to the first direction, wherein each of the conductive line patterns has a line shape extending in the second direction, wherein the bit lines are electrically connected to the channel structures, wherein the conductive line patterns are insulated from the channel structures, wherein a width of each of the conductive line patterns is different from a width of each of the bit lines, and wherein the bit line groups and the conductive line patterns vertically overlap with at least one of the gate electrode layers.

16. The semiconductor device of claim 15, wherein the width of each of the conductive line patterns is greater than the width of each of the bit lines.

17. The semiconductor device of claim 15, wherein a number of the bit lines of the first bit line group is the same as a number of the bit lines of the second bit line group.

18. The semiconductor device of claim 15, wherein the channel structures do not overlap with the conductive line patterns in the vertical direction.

19. The semiconductor device of claim 15, further comprising:

horizontal wirings electrically connected to the gate electrode layers by gate contact plugs and vertically overlapping with the stacked structure, wherein a width in the second direction of a group of the horizontal wirings vertically overlapping with the stacked structure is smaller than a length in the second direction of each of the bit lines, and wherein the width in the second direction of the group of the horizontal wirings vertically overlapping with the stacked structure is smaller than a length in the second direction of each of the conductive line patterns.

20. The semiconductor device of claim 15, further comprising:

a lower horizontal pattern at a lower level than the stack structure and including a common source; and at least one contact plug between the lower horizontal pattern and at least one of the conductive line patterns, wherein the at least one contact plug is configured to connect the common source to at least one of the plurality of conductive line patterns.

* * * * *